United States Patent
Kato et al.

(10) Patent No.: US 6,717,868 B2
(45) Date of Patent: Apr. 6, 2004

(54) SEMICONDUCTOR MEMORY DEVICE AND CONTROL METHOD THEREOF

(75) Inventors: Yoshiharu Kato, Kasugai (JP); Satoru Kawamoto, Kasugai (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 10/260,286

(22) Filed: Oct. 1, 2002

(65) Prior Publication Data

US 2003/0185061 A1 Oct. 2, 2003

(30) Foreign Application Priority Data

Mar. 27, 2002 (JP) ...................................... 2002-087775

(51) Int. Cl.$^7$ ................................................ G11C 7/00
(52) U.S. Cl. ........................................ 365/194; 365/195
(58) Field of Search ................................. 365/194, 195

(56) References Cited

U.S. PATENT DOCUMENTS

| 4,924,443 A | * | 5/1990 | Mattausch | ................... 365/203 |
| 6,611,470 B2 | * | 8/2003 | Hidaka | ........................ 365/222 |

FOREIGN PATENT DOCUMENTS

| JP | 09-161477 | 6/1997 |
| JP | 2001-236798 | 8/2001 |

* cited by examiner

*Primary Examiner*—Michael Tran
(74) *Attorney, Agent, or Firm*—Arent Fox Kintner Plotkin & Kahn, PLLC

(57) ABSTRACT

There is provided an inventive semiconductor memory device and control method thereof capable of preventing shift operation to deactivated state and data access due to transition of address signals from occurring concurrently without accompanying delay of access time, thereby to prevent data-holding characteristic of memory cell from deteriorating. A column selecting circuit 16 is deactivated based on an input signal EXBn outputted to a glitch canceller 20 prior to precharge signal PRE so as to prevent selection of a column selecting signal CLn and deactivation of a word line WL from occurring concurrently. This manner substitutes for taking delay time τD that is to be added to signals CAGn from which glitch noises due to transition of address CAn are eliminated. Thereby, address-access time, namely, from transition of address CAn till selection of a column selecting signal CLn, is kept in the shortest access time tAAX0 and the column selecting circuit 16 can be deactivated prior to deactivation of the word line WL.

10 Claims, 9 Drawing Sheets

CONTROL SECTION FOR ADDRESS ACCESS DIRECTED TO PRESENT EMBODIMENT

OPERATIONAL WAVEFORMS FOR ILLUSTRATING PRINCIPLE OF PRESENT INVENTION

FIG. 2 CIRCUIT BLOCK DIAGRAM OF SEMICONDUCTOR MEMORY DIRECTED TO PRESENT EMBODIMENT

OPERATIONAL WAVEFORMS FOR ILLUSTRATING INTERFERENCE PREVENTION BETWEEN ADDRESS ACCESS AND EXTERNAL INSTRUCTION SIGNAL, DIRECTED TO PRESENT EMBODIMENT

FIG. 5  CONTROL SECTION FOR ADDRESS ACCESS OF SPECIFIC EXAMPLE DIRECTED TO PRESENT EMBODIMENT

OPERATIONAL WAVEFORMS OF SPECIFIC EXAMPLE

FIG. 7 OPERATIONAL WAVEFORMS FOR ILLUSTRATING INTERFERENCE BETWEEN ADDRESS ACCESS AND EXTERNAL INSTRUCTION SIGNAL

CONTROL SECTION FOR ADDRESS ACCESS OF RELATED ART

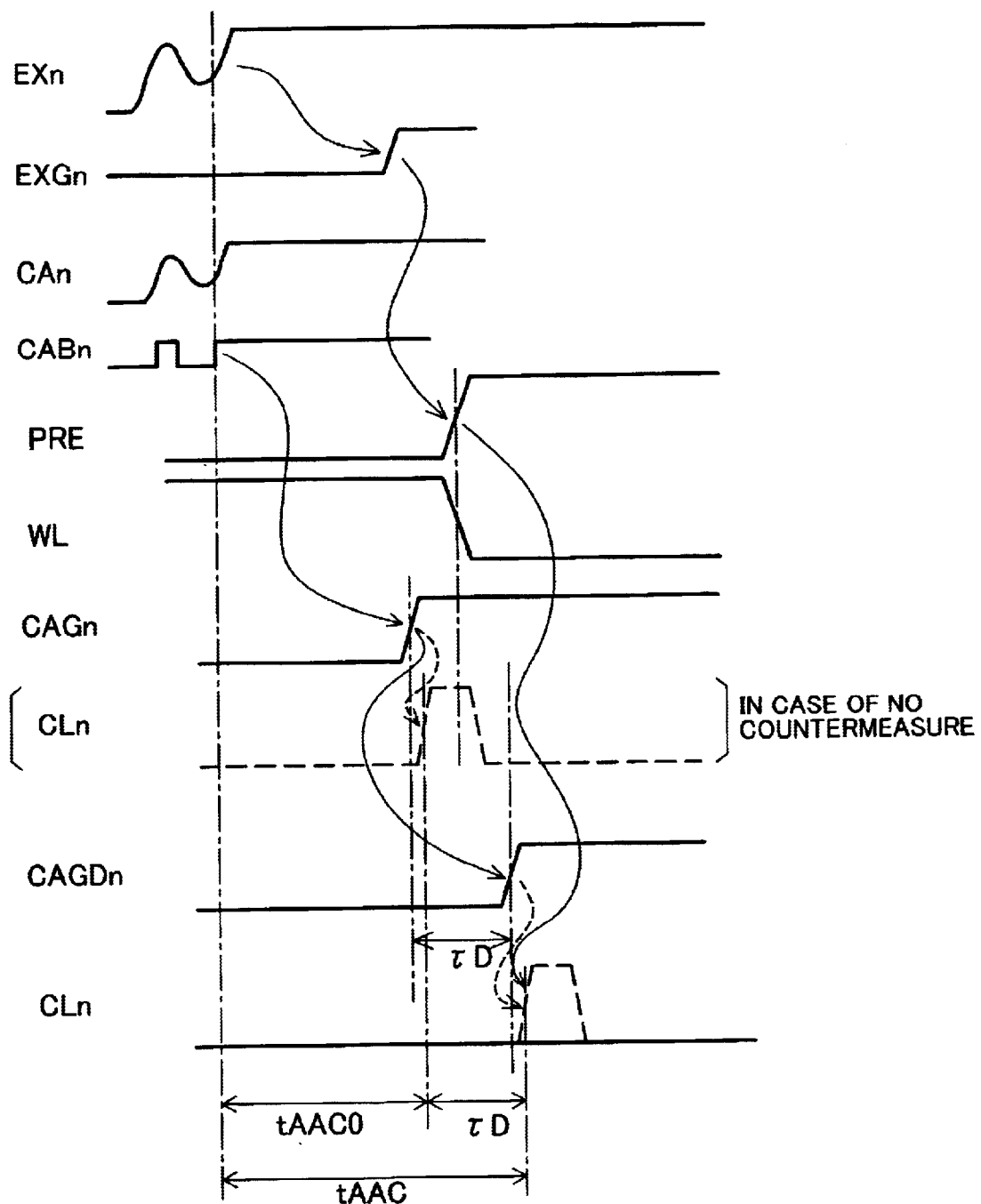

SEMICONDUCTOR MEMORY DEVICE AND CONTROL METHOD THEREOF

BACKGROUND OF THE INVENTION

1. Field of the Invention

The present invention relates to a semiconductor memory device and a control method thereof capable of executing data-access to a corresponding memory cell in response to address transition under active state. More particularly, it relates to a semiconductor memory device and a control method thereof that need to remedy data-storage level of memory cells that has lowered during data-access of memory cells, after the data access is executed.

2. Description of Related Art

A semiconductor memory device such as DRAM stores data in memory cells in a form of charges stored in cell capacitors. For data-access with respect to such type of semiconductor memory, a cell capacitor is firstly connected to a bit line and amplified by a sense amplifier. After that, the bit line is connected to a data line, whereby input/output of data-can be executed. Voltage level of data lines may be limited lower compared with that of bit lines so as to secure high-speed access performance. Furthermore, in case a data line is shared by a plurality of bit lines, voltage level of the data line may possibly be precharged or equalized to predetermined voltage level before the data line is connected to one of the bit lines. Accordingly, even though the data line with any voltage level is connected to one of the bit lines, voltage level of the bit line and that of the data line differ from each other. Therefore, voltage level of the bit line is likely to receive voltage interference from the data line. For example, at bit line, high-level voltage lowers whereas low-level voltage rises. In this case, a bit line is connected to a cell capacitor. Accordingly, data-storage level lowers simultaneously and so-called disturb phenomenon occurs. Bit lines under the influence of voltage interference due to disturb phenomenon are electrically separated from data lines. After that, a sense amplifier amplifies voltage of bit lines to get their voltage level back to before-disturb-phenomenon.

Furthermore, as one of the data-access functions provided for the above semiconductor memory, address-access function is significant. The address-access function is to execute data-access to memory cells corresponding to inputted addresses transitions made on demand while the semiconductor memory is in active state. With this manner of the address-access function, data held in a plurality of bit lines are amplified. As address transition is made on demand, a bit line corresponding to the address transition is selected and connected to a data line. Address access thus can be realized. This function enables a semiconductor memory device to receive addresses transition on demand.

FIG. 7 shows operational waveforms for illustrating address access function of a semiconductor memory that accompanies disturb phenomenon at the time of data access. When the semiconductor memory is activated by an external instruction signal, a word line WL starts up. Subsequently, a plurality of bit lines BL0 through BLx are connected to memory cells and differential amplification is applied to pairs of bit lines (BL0Z and BL0X through BLXZ, and BLXX). When an address ADD makes address transition to an address signal ADD0, a column selecting line CL0 is driven in a manner of pulse drive so as to connect a bit line BL0, corresponding to the address signal ADD0, to a data line. Since data lines different in their voltage level are connected to a pair of bit lines (BL0Z and BL0X) to which differential amplification are applied, the pair of bit lines (BL0Z and BL0X) receive voltage interference and difference of voltage level lowers. After the column selecting line CL0 is selected, this voltage level that has lowered gets back to before-disturb-phenomenon voltage level on condition that differential amplification continues. As an address ADD makes address transition to an address signal ADD, the column selecting line CL0 is selected within an access time tAAC0 (see (1) in FIG. 7).

The address ADD makes address transition on demand asynchronously while the semiconductor memory is set in active state in accordance with an external instruction signal (the external instruction signal is a low-level signal in FIG. 7). Accordingly, final address transition is made in simultaneous with deactivation timing of an external instruction signal. In FIG. 7, the address transition to the address signal ADDX corresponds to the final address transition. In this case, although it depends on internal circuit structure of the semiconductor memory and operation-speed of the internal circuit, there may occur a case that a word line WL is deactivated along with deactivation of the external instruction signal while a column-selecting line CLX is selected in response to address access corresponding to address transition to the address signal ADDX. That is, upon selection of the column-selecting line CLX, bit lines and data lines are connected to one another and a word line WL gets deactivated while disturb phenomenon occurs. As a result, memory cells can store electric charges that have low voltage level due to the disturb phenomenon, whereby data holding characteristic deteriorates (see (2) in FIG. 7).

Conventionally, there has been conceived circuit structure as shown in FIG. 8 so as prevent data holding characteristic from deteriorating. FIG. 9 shows operational waveforms directed to the circuit structure of FIG. 8. Address signals CAn and external instruction signals Exn both inputted from an external are inputted to a semiconductor memory as signals CAGn and signals EXGn, respectively, through address buffers 10 . . . 10, input buffers 18( . . . 18), and glitch cancellers 12 . . . 12 and 20( . . . 20) for eliminating glitch noises. Delay circuits 14 . . . 14 are arranged between the glitch cancellers 12 . . . 12 and a column selecting circuit 16. Delay time τD corresponds to time for a signal CAGn to propagate to the column selecting circuit 16 as delay signals CAGDn. This delay time τD is set longer than time required for discriminating signals EXGn by an external-instruction discriminating circuit 22 and outputting a precharge signal PRE. Thereby, delay signals CAGDn propagate delaying against a precharge signal PRE. As a result the precharge signal PRE deactivates the column selecting circuit 16 to mask column-selecting signal CLn. Therefore, a column-selecting signal CLn and a word line WL are never output concurrently.

It should be noted that there are a plurality kinds of external instruction signals EXn and combinations of those signals EXn set various instructions. Therefore, the external-instruction discriminating circuit 22 is arranged. In case single external instruction signal EXn sets an instruction, the external-instruction discriminating circuit 22 is not required.

The above related art directed to FIG. 8 and FIG. 9 includes the delay circuits 14 . . . 14 so as to add delay time τD to input paths of address signals CAn with deactivation timing derived from external instruction signals EXn. Thereby, propagation time of delay signals CAGDn, derived from transition of the address signals CAn, is delayed so that selection of a column-selection signal CLn and deactivation of a word line WL should not be done concurrently. This system is to prevent data holding characteristic for memory cells from deteriorating.

However, since the delay circuits 14 are arranged on propagation paths for address signals, delay time τD is added every time address signals are propagated. Therefore, delay time τD is always forcedly added to access time tAAC0 which is inherent shortest access time feasible with the circuit structure, i.e., address access time tAAC= tAAC0+τD. Due to insertion of the delay circuit, high-speed-access ability inherently given to such structured circuit cannot be shown. This is problematic because demand on high-speed-access operation cannot fully be satisfied.

Furthermore, it is possible to realize address-access function with address access time tAAC0, inherent shortest access time feasible with the circuit structure, by getting rid of the delay circuits 14. However, without the delay circuits 14, selection of a column-selecting signal CLn and deactivation of a word line WL are done concurrently with deactivation timing of external instructions signals EXn. Thereby, data-holding characteristic of memory cells deteriorates, which is problematic.

SUMMARY OF THE INVENTION

The present invention is made to resolve problems of the related art. The present invention is made for a semiconductor memory device that has address-access function to execute data access to corresponding memory cells in response to transition of address signals on demand while the semiconductor memory device is in active state. There is provided an inventive semiconductor memory device and control method thereof capable of preventing shift operation to deactivated state and data access due to transition of address signals from occurring concurrently without accompanying delay of access time, thereby to prevent data-holding characteristic of memory cells from deteriorating.

To achieve the object, according to one aspect of the present invention, there is provided a semiconductor memory device comprising: a plurality of column selecting switches for connecting one of a plurality of bit lines, each of which is connected to memory cells, and a data input/ output line when a word line is activated based on at least one external control signal; a column selecting section for selecting a column selecting switch corresponding to at least one external address signal that has made address transition every time at least one external address signal makes address transition while the word line is in active state; at least one control-signal certifying section for outputting a certified control signal in case transition of a signal inputted to an external control terminal is certified valid as the external control signal; and at least one address certifying section for outputting at least one certified address signal in case transition of a signal inputted to an external address terminal is certified valid as the external address signal; wherein the column selecting section is controlled to be active in accordance with transition of a signal inputted to the external control terminal.

According to the semiconductor memory device directed to one aspect of the present invention, activation control of a word line is executed by certifying transition of a signal inputted to at least one external control terminal as a valid external control signal on condition that a plurality of memory cells are selected and connected to corresponding bit lines upon activation of a word line. Similarly, a bit line to be connected to a data input/output line is set by certifying transition of a signal inputted to at least one external address terminal as a valid external address signal. The column selecting section selects column selecting switch in accordance with a bit line set. The column selecting section is controlled and activated based on transition of a signal inputted to at least one of the external control terminals.

Furthermore, according to another aspect of the present invention, there is provided a control method of semiconductor device, while a word line is in active state, the control method comprising: address signal certifying process for certifying whether or not transition of a signal inputted to at least one external address terminal is valid as an external address signal; control signal certifying process for certifying whether or not transition of a signal inputted to at least one external control terminal is valid as an external control signal; word line deactivating process for deactivating a word line based on the external control signal; and column-selection deactivating process for prohibiting connection of a bit line corresponding to the external address signals and a data input/output line based on transition of a signal inputted to the external control terminal.

In the control method of semiconductor device according to another aspect of the present invention, the address signal certifying process certifies whether or not transition of a signal inputted to at least one external address terminal is transition to a valid external address signal, and the control signal certifying process certifies whether or not transition of a signal inputted to at least one external control terminal is transition to a valid external control signal. Furthermore, the word line deactivating process deactivates a word line based on at least one external control signal. The column-selection deactivating process prohibits connection of a bit line corresponding to the external address signals and a data input/ output line based on transition of a signal inputted to at least one of the external control terminals.

Thereby, connection of a bit line and a data input/output line is prohibited based on transition of a signal inputted to at least one external control terminal before the control signal certification processing is applied to the signal. Accordingly, a bit line is never connected to a data input/ output line even if transition of a signal inputted to an external address terminal is certified as a valid external address signal when an external control signal is certified and a word line is deactivated. Thereby, there never occurs disturb phenomenon due to connection of a bit line and data input/output line while a word line is deactivated. Accordingly, data-holding characteristic of memory cells never deteriorates.

It is not necessary to insert means to adjust timing of propagation delay or the like in a signal path between an external address terminal and a terminal of a portion to certify validity of an external address signal so as avoid concurring connection of a bit line and a data input/output line, and deactivation of a word line. Accordingly, there never increases delay of access time for data access to be conducted in response to transition of an external address signal.

The above and further objects and novel features of the invention will more fully appear from the following detailed description when the same is read in connection with the accompanying drawings. It is to be expressly understood, however, that the drawings are for the purpose of illustration only and are not intended as a definition of the limits of the invention.

BRIEF DESCRIPTION OF THE DRAWINGS

FIG. 9 shows operational waveforms for illustrating interference prevention between address access and external instruction signal, directed to the related art.

DETAILED DESCRIPTION OF THE PREFERRED EMBODIMENTS

Principle of the present invention, preferred embodiments of a semiconductor memory device, control method thereof will be described by referring to FIG. 1 through FIG. 6.

Figure 1:
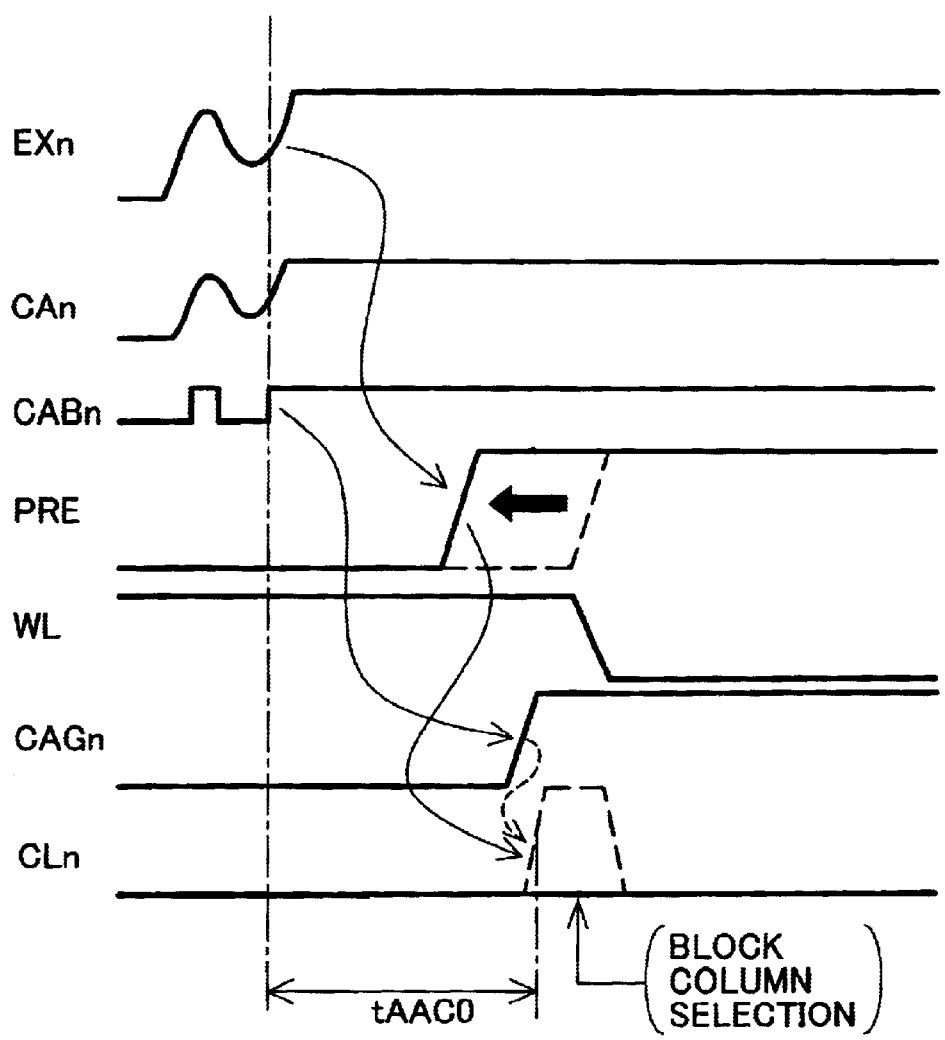
FIG. 1 shows operational waveforms for illustrating the principle of the present invention.

FIG. 1 shows operational waveforms for illustrating principle of the present invention. To be more specific, FIG. 1 shows a case that an address signal CAn makes address transition concurrently with deactivation timing due to high-level transition of an external instruction signal Exn. An address signals CAn inputted from an external address turns into a signal CABn corresponding to an address signal. The signal CABn further turns into a certifying signal CAGn from which glitch noises are eliminated. That is, transition of the address signal CAn propagates as certifying signal CAGn. Based on the certifying signal CAGn, a column-selecting signal CLn is selected. Consequently, the shortest address access time tAAC0 can be obtained.

On the other hand, an external instruction signal EXn is inputted from the external terminal and glitch noises of it are eliminated, similar to an address signal CAn. Furthermore, type of the external instruction is discriminated on demand. In case the external instruction is discriminated as precharge, a precharge signal PRE is outputted and deactivation operation is started. More specifically, deactivation of a word line WL is conducted.

Instead of adding delay time τD to a certifying signal CAGn in the related art, in the present invention, a signal to mask a column selecting signal CLn is generated prior to a precharge signal PRE on condition that there is secured the shortest access time tAAC0 that is address-access time from transition of an address signal CAn until selection of a column selecting signal CLn. This system is to avoid concurring selection timing of a column selecting signal CLn and deactivation timing of a word line WL.

Thereby, a column selecting signal CLn can be masked prior to deactivation of a word line WL. In other words, a column selecting signal CLn is never selected while a word line WL is deactivated.

Figure 2:
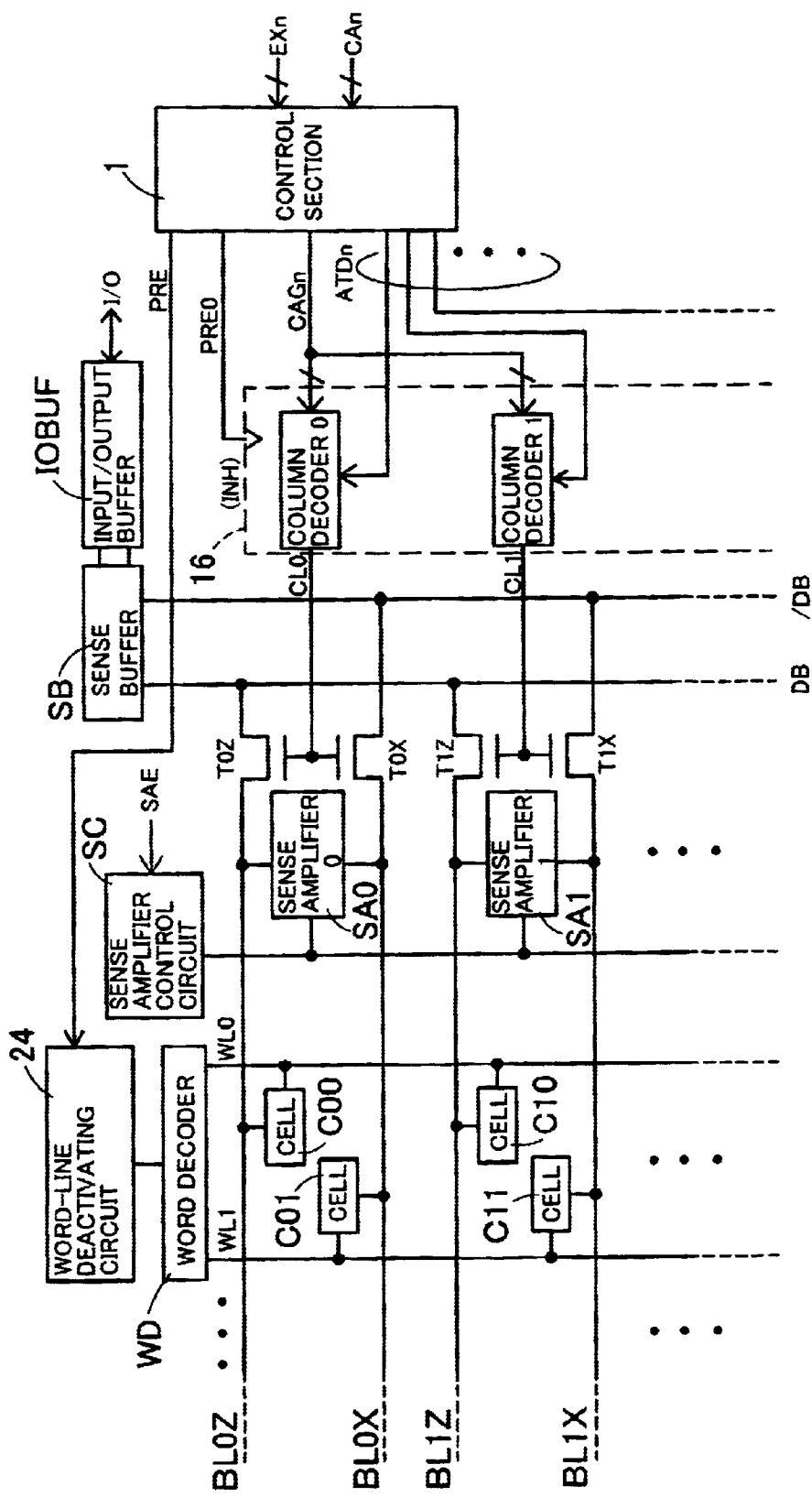
FIG. 2 shows a circuit block diagram of a semiconductor memory directed to the present embodiment.

FIG. 2 shows a circuit block diagram of a semiconductor memory directed to the present embodiment. Memory cells C00 through C11 are controllably connected to bit lines BL0Z, BL0X, BL1Z, BL1X. Word lines WL0, Wl1 are activated by a word decoder WD upon deactivation of a precharge signal PRE outputted from a control section 1 based on external instruction signals EXn. Subsequently, memory cells (C00, C10) or (C01, C11) are connected to the bit lines (BL0Z, BL1Z) or (BL0X, BL1X) so that charges stored in the memory cells (C00, C10) or (C01, C11) should be redistributed to the bit lines (BL0Z, BL1Z) or (BL0X, BL1X). Differential amplification is applied to pairs of bit lines (BL0Z, BL0X) and (BL1Z, BL1X) by sense amplifiers SA0 and SA1, respectively, that are controlled by a sense amplifier activating signal SAE via a sense amplifier control circuit SC.

In case column address signals CAn make address transitions on condition that either the word line WL0 or WL1 is in active state and differential amplification is applied to the pairs of bit lines (BL0Z, BL0X) and (BL1Z, BL1X), the control section 1 outputs certifying signals CAGn eliminating glitch noises due to chattering that occurs when column address signals CAn make address transitions. The certifying signals CAGn are inputted to a column selecting circuit 16 and each column decoder (column decoder 0, column decoder 1) executes decoding so as to select either one of the pair of bit lines (BL0Z, BL0X) or (BL1Z, BL1X) that corresponds to the column address signals CAn that made address transitions.

Furthermore, the control section detects transitions of the column address signals CAn and outputs an address transition signal ATDn. An address transition signal ATDn is a pulse signal triggered with transitions of column address signals CAn and inputted to a corresponding column decoder (column decoder 0 or column decoder 1).

The column selecting circuit 16 outputs a column selecting signal CL0 or CL1 selected in accordance with a decoding result at each of the column decoders 0 and 1 in a form of pulse signal synchronizing with an address transition signal ATDn. Column selecting signals CL0, CL1 are transmitted to column gates T0Z and T0X and gate terminals of T1Z and T1X. During a pulse period of a selected column selecting signal CL0 or CL1, corresponding column gates (T0Z, T0X) or (T1Z, T1X) are made conductive so as to connect the corresponding pair of bit lines (BL0Z, BL0X) or (BL1Z, BL1X) and a pair of data lines (DB, /DB). While those pairs of lines are connected, data read out to the pair of bit lines (BL0Z, BL0X) or (BL1Z, BL1X) are amplified at a sense buffer SB and outputted from an input/output buffer IOBUF. Furthermore, write data inputted to the input/output buffer IOBUF is written in the pair of bit lines (BL0Z, BL0X) or (BL1Z, BL1X) through a write amplifier (not shown) and the pair of the data lines (DB, /DB). The present embodiment describes a case that data-read and data-write are conducted through same pair of data lines (DB, /DB). However, there may be provided two pairs of data lines, one for data-read and another one for data-write, to get access to a pair of bit lines.

With the circuit structure shown in FIG. 2, the control section 1 outputs an address transition signal ATDn in a form of pulse in response to transition of signal level of column address signals CAn. This address transition signal ATDn works as a trigger to select either one of column selecting signal CL0 or CL1 corresponding to the column address signals CAn that have made address transitions, whereby data access gets started. That is, this circuit structure brings address access function that data-access can be conducted for every transition of column address signals CAn on demand on condition that the word line WL0 or WL1 is in active state and data stored in memory cells are amplified in a manner of differential amplification at the pairs of bit lines (BL0Z, BL0X) and (BL1Z, BL1X).

When a precharge signal PRE outputted from the control section 1 is activated based on external instruction signals EXn, a word-line deactivating circuit 24 is activated to control word decoder WD, whereby the word line WL0 or WL1 that has been activated is deactivated. A column-selection deactivating signal PRE0 activated prior to deactivation of the word line WL0 or WL1 is inputted to a deactivation terminal (INH) of the column selecting circuit 16, whereby the column selecting circuit is deactivated.

Figure 3:
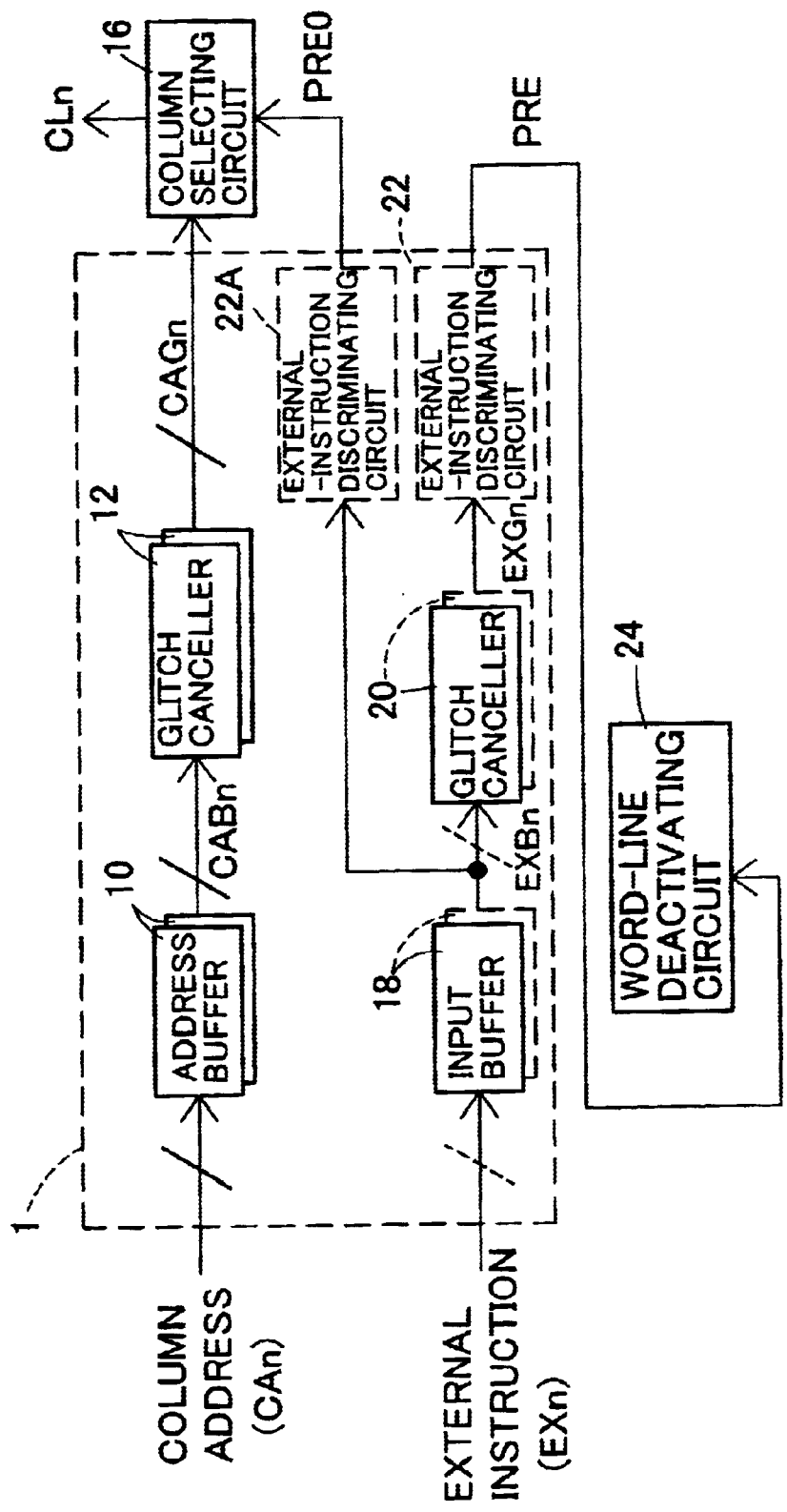
FIG. 3 shows a circuit block diagram of a control section for address access directed to the present embodiment.

FIG. 3 shows a circuit block diagram of a control section concerning the control section 1 and address access function. Column address signals CAn and external instruction signals EXn both of which are inputted from the external are inputted to address buffers 10 . . . 10 and input buffer(s) 18( . . . 18), respectively. Signals CABn and EXBn are outputted from the address buffers 10 . . . 10 and the input buffer(s) 18( . . . 18) and outputted as certifying signals CAGn and EXGn through glitch cancellers 12 . . . 12 and 20( . . . 20), respectively. The glitch cancellers 12 . . . 12 and 20( . . . 20) are to eliminate glitch noises due to chattering or the like caused by transition of signal. Certifying signals CAGn for column address signals CAn are inputted to a column selecting circuit 16 and decoded to select a corresponding bit line. Certifying signals EXGn for external instruction signals EXn are inputted to an external-instruction discriminating circuit 22 and content of instruction is discriminated, if necessary. FIG. 3 shows a case that a deactivating instruction comes along as a discrimination result and in this case, a precharge signal PRE is outputted to a word-line deactivating circuit 24.

After external instruction signals EXn are inputted to the input buffer(s) 18( . . . 18), output signals EXBn, resultant signals of the external instruction signals EXn, are inputted to a external-instruction discriminating circuit 22A, if necessary. In case external instruction signals EXn mean deactivation instruction, a column-selection deactivating signal PRE0 is outputted to the column selecting circuit 16 prior to output of a precharge signal PRE, whereby the column selecting circuit 16 is deactivated.

Figure 4:
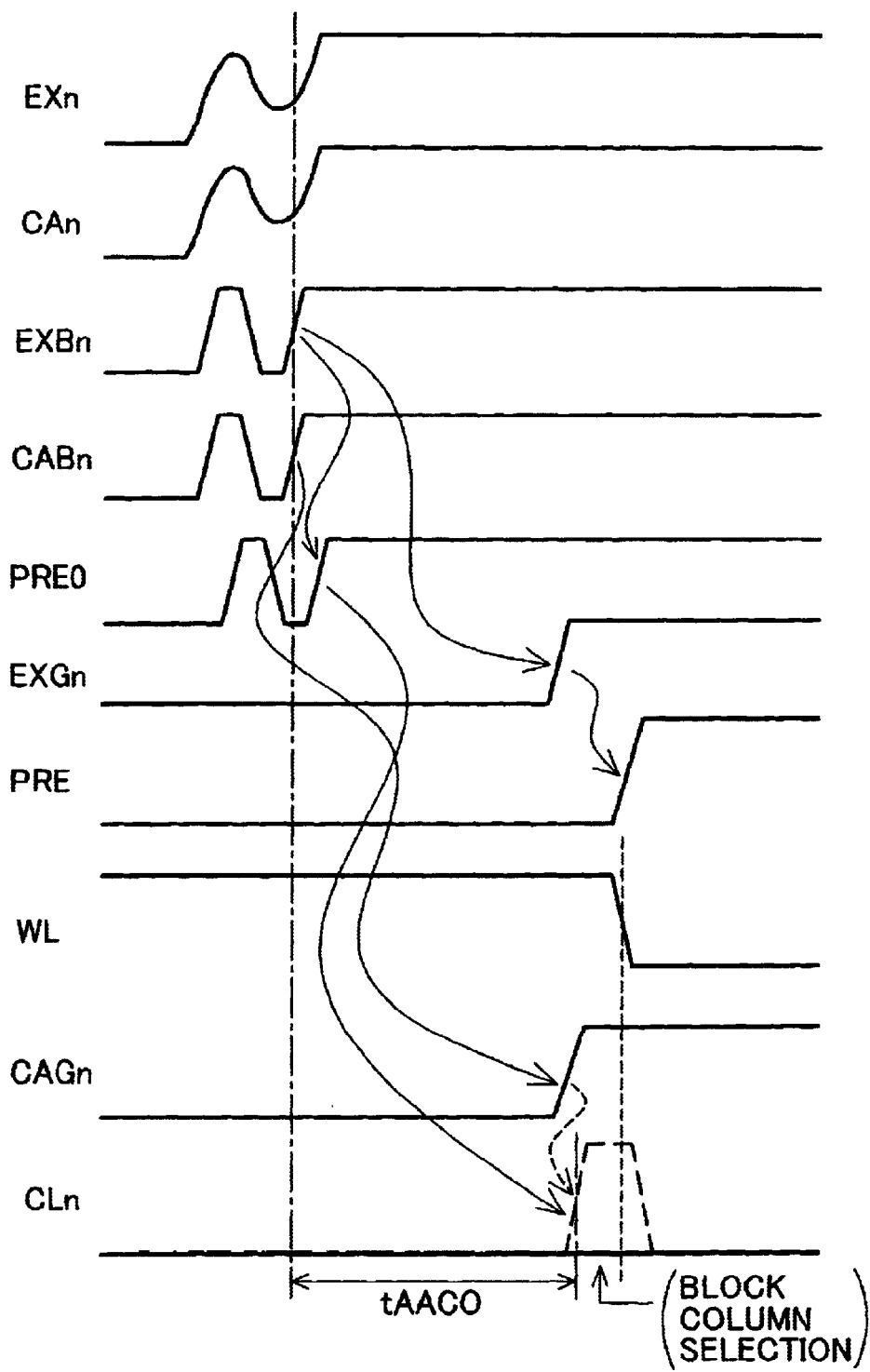
FIG. 4 shows operational waveforms for illustrating interference prevention between address access and external instruction signal, directed to the present embodiment.

FIG. 4 is for illustrating operation to prevent interference of two different operations, i.e., a case that deactivation instruction by an external instruction signal EXn and transition of a column address signal CAn are inputted simultaneously. With respect to an external instruction signal EXn and a column address signal CAn, in case signal transition with pulse-formed glitch noises is inputted prior to valid signal transition, the input buffer(s) 18( . . . 18) and the address buffers 10 . . . 10 output in-phase signals EXBn and CABn in a forms of rectangular pulse, respectively, upon receipt of the signal transition with glitch noises.

The signals EXBn and CABn are inputted to the glitch cancellers 12 . . . 12 and 20( . . . 20). The glitch cancellers 12 . . . 12 and 20( . . . 20) cut out signals that have spent a predetermined time since the signals including glitch noises made transition, and output certifying signals EXGn and CAGn. Because the signals that have spent a predetermined time since the signals including glitch noises made transition are cut out, the certifying signals EXGn and CAGn are delay signals for the signals EXBn and CABn.

On the other hand, signals EXBn, in-phase with external instruction signals Exn, are inputted to an external-instruction discriminating circuit 22A without glitch noises being eliminated. In case the signals EXBn are discriminated as deactivation instruction, a column-selection deactivating signal PRE0 is outputted to the column selecting circuit 16.

FIG. 4 illustrates that the column-selection deactivating signal PRE0 starts up delaying from start-up of a signal EXBn by discrimination time. However, in case an external instruction signal EXn is a sole signal, the external-instruction discriminating circuit 22A is not required and the signal EXBn as it is can possibly be used as a column-selection deactivating signal PRE0. Furthermore, since a column-selection deactivating signal PRE0 is generated based on a signal EXBn glitch noises of which are not eliminated, the column-selection deactivating signal PRE0 is preferably a signal to be outputted depending on signal level of a signal EXBn without using a latch-type circuit structure as an external-instruction discriminating circuit 22A. Though glitch noises of an external instruction signal EXn are outputted together with a column-selection deactivating signal PRE0, the column-selection deactivating signal PRE0 is outputted prior to an output of precharge signal PRE. This manner of signal-output sequence is acceptable as long as a valid output can be obtained after a signal obtained after termination of a glitch noise period becomes stable.

Upon an instruction discrimination result with respect to a certifying signal EXGn, a column-selection deactivating signal PRE0 is outputted to deactivate the column selecting circuit 16. Thereby, deactivation of the column selecting circuit 16 can be made prior to deactivation of a word line WL by a word line deactivating circuit 24 that is controlled by a precharge signal PRE. A column selcting signal CLn is never selected in response to a certifying signal CAGn corresponding to a column address signal CAn that propagates after an output of a column-selection deactivating signal PRE0. Accordingly, deactivation of a word line WL and a selection period of a column selecting signal CLn do not overlap.

Figure 5:
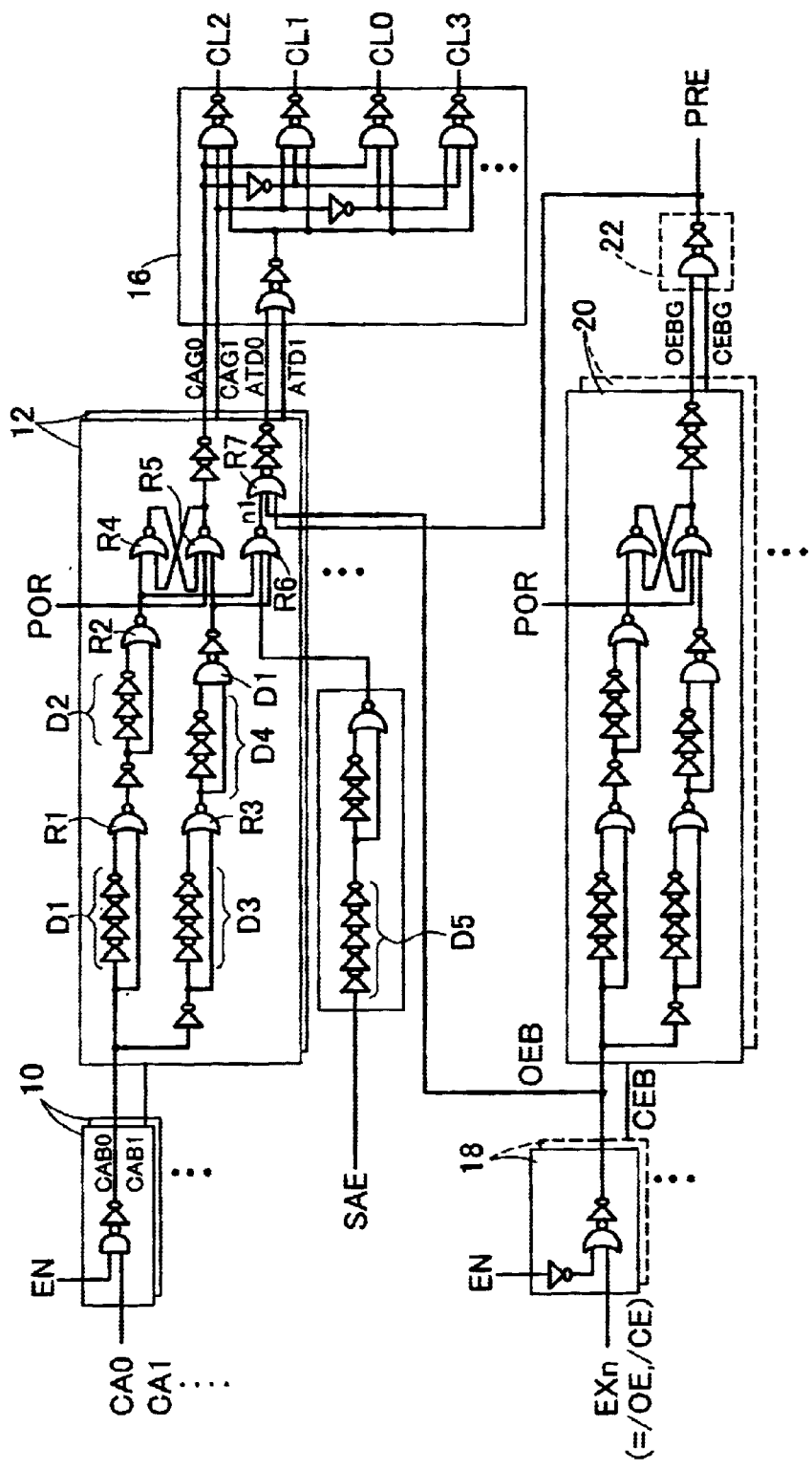
FIG. 5 shows a circuit block diagram of a control section for address access of a specific example directed to the present embodiment.

FIG. 5 is a specific example of the circuit block diagram as shown in FIG. 3. Each of the address buffers 10 for receiving column address signals CA0, CA1 is constituted by serial connection of a NAND gate and an inverter gate. An enable signal EN enables such-structured address buffers 10 to receive input signals. In case an enable signal EN is in high-level, there are outputted signals CAB0, CAB1 that are in-phase to column address signals CA0, CA1, respectively.

Similar to the address buffers 10, as to input buffers 18 for receiving external instruction signals EXn (/OE, /CE), signals OEB, CEB that are in-phase to external instruction signals EXn (/OE, /CE) are outputted from there in case an enable signal EN is in high-level. Each of the input buffers 18 is constituted by an inverter gate for inverting an enable signal EN, a NOR gate for receiving the inverted enable signal EN and another inverter gate arranged at post stage of the NOR gate.

Glitch cancellers 12 are structured substantially same as glitch cancellers 20. Accordingly, there will be described about the glitch cancellers 12 only. Each of signals CAB0, CAB1 to be inputted is divided into two systems of signal path, namely, upper path and lower path.

In the upper path, the signal CAB0 (or CAB1) is inputted to two input terminals of a NOR gate R1. More specifically, the signal is directly inputted to one of the input terminals whereas inputted to the other input terminal through a delay circuit Dl constituted by inverter gates (delay time is τD1). The NOR gate R1 outputs a signal in high-level after an output signal from the delay circuit D1 that makes low-level transition in response to the signal CAB0 (or CAB1) that make low-level transition. That is, the NOR gate R1 outputs an output signal in high-level after glitch cancel period of delay time τD1 lapses in response to the column address signal CA0 (or CA1) that make low-level transition. In other words, there is glitch cancel effect in response to low-level transition.

In the signal path of the lower stage, there is arranged an inverter gate at the preceding stage of an input to a NOR gate R3. Stages leading to a NOR gate R3 from the inverter gate at the lower path are arranged same as the paths leading to the NOR gate R1 at the upper path. An output signal from the single inverter gate is directly inputted to one of the input terminals of the NOR gate R3 as well as to the other input terminal through a delay circuit D3 is constituted by the even-numbered stages of inverter gates (delay time is $\tau D3$). The NOR gate R3 outputs a signal in high-level after an output signal from the delay circuit D3 makes low-level transition in response to the signal CAB0 (or CAB1) that makes high-level transition. That is, the NOR gate R3 outputs an output signal in high-level after glitch cancel period of delay time $\tau D3$ lapses in response to the column address signal CA0 (or CA1) that makes high-level transition. In other words, there is glitch cancel effect in response to high-level transition.

It should be noted that there is described a case that glitch cancel periods in response to low-level transition and high-level transition are set to delay times $\tau D1$ and $\tau D3$, respectively, as an example. However, delay times $\tau D1$ and $\tau D3$ can be appropriately set to both, namely, high-level and low-level signal transitions with respect to column address signal CA0 (or CA1).

Let us return to aspects about the signal path of upper path. The signal from the NOR gate R1 that has made high-level transition is inverted at an inverter gate. After that, the signal inverted at the inverter gate is inputted to two input terminals of the NOR gate R2 as a signal that made low-level transition. More specifically, the signal is inputted to one of the input terminals of the NOR gate R2 and to the other input terminal through a delay circuit D2 constituted by the odd-numbered stages of inverter gates (delay time is $\tau D2$). The NOR gate R2 outputs pulse signals in high-level taking a delay time $\tau D2$ caused by the signal that makes low-level transition and signal that makes high-level transition after a lapse of delay time $\tau D2$ due to the delay circuit D2. That is, in case the column address signal CA0 (or CA1) that is to make low-level transition is inputted, the delay circuit D2 outputs a pulse signal in high-level after a glitch cancel period of delay time $\tau D1$ lapses. It should be noted that the delay circuit D2 and the NOR gate R2 constitute a low-input-high-pulse generating circuit that outputs the pulse signal in high-level in response to the input signal that makes low-level transition.

As to the signal path of lower path, the signal that has made high-level transition is outputted from a NOR gate R3 and then, inputted to two input terminals of a NAND gate D1. More specifically, the signal is inputted to one of the input terminals of the NAND gate D1 and to the other input terminal through a delay circuit D4 constituted by the odd-numbered stages of inverter gates (delay time is $\tau D4$). The NAND gate D1 outputs a pulse signal in low-level taking a delay time $\tau D4$ caused by the signal that makes high-level transition and the signal that makes low-level transition after a lapse of delay time $\tau D4$. Accordingly, the pulse signal in high-level is outputted from an inverter gate arranged at post stage of the NAND gate D1. That is, in case the column address signal CA0 (or CA1) that is to make high-level transition is inputted, the delay circuit D4 outputs a pulse signal in high-level after a glitch cancel period of delay time $\tau D3$ lapses. It should be noted that the delay circuit D4 and the NAND gate D1 constitute a high-input-high-pulse generating circuit that outputs the pulse signal in high-level in response to the input signal that makes high-level transition.

The pulse signal positive to the column address signal CA0 (or CA1) in low-level transition is outputted from the NOR gate R2 and then, inputted to NOR gates R4, R5 that constitute a flip-flop. On the other hand, the pulse signal positive to the column address signal CA0 (or CA1) in high-level transition is outputted from the inverter gate arranged at post stage of the NAND gate D1 and then, inputted to a NOR gate R6.

A power-on reset signal POR of a high-level pulse signal sets an output signal from the NOR gate R5, i.e., an output from the flip-flop, in low-level for initialization. After that, the output signal from the flip-flop is set high-level in response to low-level transition of the column address signal CA0 (or CA1) whereas set low-level in response to high-level transition. There is outputted signal level of which is opposite to signal level of the column address signal CA0 (or CA1) in response to the certifying signal CAG0 (or CAG1) outputted through two-staged inverter gates arranged at next stage of the flip-flop.

An output signal from the NOR gate R2 and an output signal from the inverter gate arranged at the next stage of the NAND gate D1 are inputted to the NOR gate R6. In case either one of the output signals is outputted in a form of high-level pulse signal, a low-level pulse signal is outputted from an output terminal n1 of the NOR gate R6. Since the output terminal n1 is connected to one of the input terminals of a NOR gate R7, in case of activated state where the other input terminals of the NOR gate R7 is in low-level, high-level pulse signal is outputted from the NOR gate R7. The high-level pulse signal is outputted as address transition signal ATD0 (or ATD1) passing through a two-staged inverter gate.

Furthermore, a signal derived from sense-amplifier activating signal SAE is inputted to the NOR gate R6. Sense-amplifier activating signal SAE is logically inverted by the delay circuit D5 constituted by odd-number-staged inverter gates (delay time is $\tau D5$) and then, inputted to a low-input-high-pulse generating circuit. Accordingly, high-level pulse signal is inputted to the NOR gate R6 after sense-amplifier activating signal SAE in high-level transition activates a sense amplifiers and a delay time $\tau D5$ passes from activation of the sense amplifiers. An input of the pulse signal generates the high-level pulse signal of the address transition signal ATD0 (or ATD1).

The column selecting circuit 16 is a typical address decoder. FIG. 5 shows a decoding circuit for decoding certifying signals CAG0, CAG1. To each logic level of (CAG0, CAG1), one of the column selecting signals CL0 through CL3 is selected. That is, CL3 is selected in response to (CAG0, CAG1)=(0, 0), CL0 is selected to (CAG0, CAG1)=(1, 0), CL1 is selected to (CAG0, CAG1)=(0, 1), and CL2 is selected to (CAG0, CAG1)=(1, 1). Since certifying signals CAG0, CAG1 and column address signals CA0, CA1 are in opposite phase one another, with respect to each logic level of (CA0, CA1), CL2 is selected in response to (CAG0, CAG1)=(0, 0), CL1 is selected to (CAG0, CAG1)=(1, 0), CL0 is selected to (CAG0, CAG1)=(0, 1), and CL3 is selected to (CAG0, CAG1)=(1, 1). It should be noted that since a logical add signal of address transition signals ATD0 and ATD1 is inputted to the column selecting circuit 16 as trigger signal, column selecting signals CL0 through CL3 decoded are selected in synchronous with a high-level pulse signal of address transition signal ATD0 or ATD1.

External instruction signals EXn (/OE, /CE) are inputted to the input buffers 18. Signals OEB, CEB outputted from the input buffers 18 are inputted to the glitch cancellers 20. Certifying signals OEBG, CEBG are outputted from the glitch cancellers 20 and then, inputted to the external-instruction discriminating circuit 22 that discriminates deactivation instruction. A NAND gate and an inverter gate are arranged in serial in the external-instruction discriminating circuit 22 and logical multiplication operation of certifying signals OEBG and CEBG is executed there. That is, in case both /OE and /CE, external signals, are in high-level, the external-instruction discriminating circuit 22 discriminates deactivation state and outputs a precharge signal PRE. A precharge signal PRE is inputted to the word-line deactivating circuit 24 (see FIG. 3) as well as to the NOR gates R7 arranged in each of the glitch cancellers 12. Thereby, address transition signals ATD0, ATD1 are set in low-level under deactivated state and column selecting signals CL0 through CL3 are kept in non-selected state.

Furthermore, a signal OEB is inputted to each of the NOR gates R7. The signal OEB makes high-level transition in synchronous with timing that an external instruction signal /OE makes high-level transition and an output-prohibiting state instruction is given. Accordingly, address transition signals ATD0, ATD1 can be fixed in low-level and column selecting signals CL0 through CL3 can be kept in non-selected state without postponing until timing that precharge signal PRE is activated after elimination of glitch noises. In the specific example shown in FIG. 5, sole external instruction signal /OE can control deactivation of the column selecting circuit 16. Accordingly, the external-instruction discriminating circuit 22A is an unnecessary structural element. A certifying signal OEB corresponds to a column-selection deactivating signal PRE0 in FIG. 3.

Figure 6:
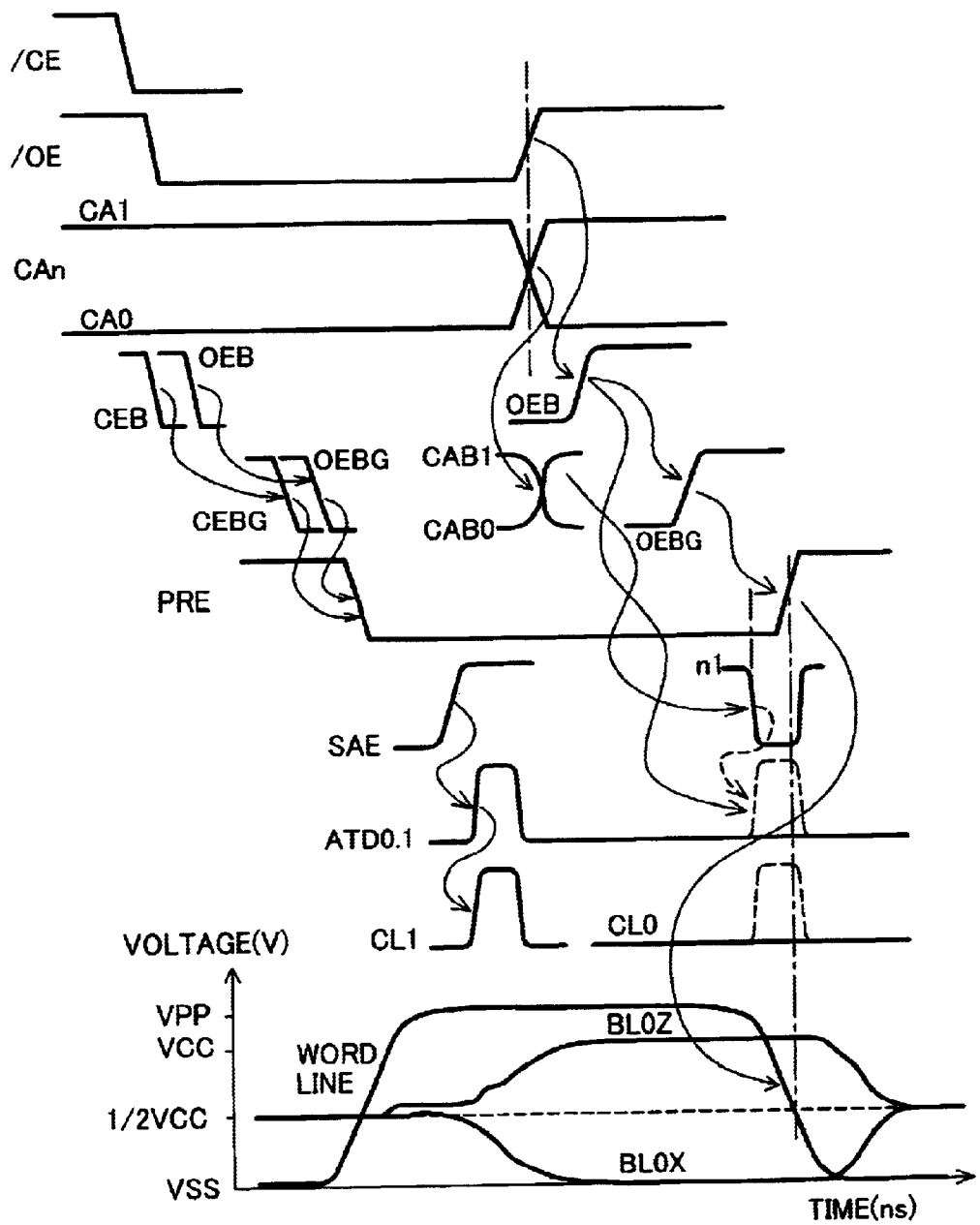
FIG. 6 shows operational waveforms of the specific example.
Figure 7:
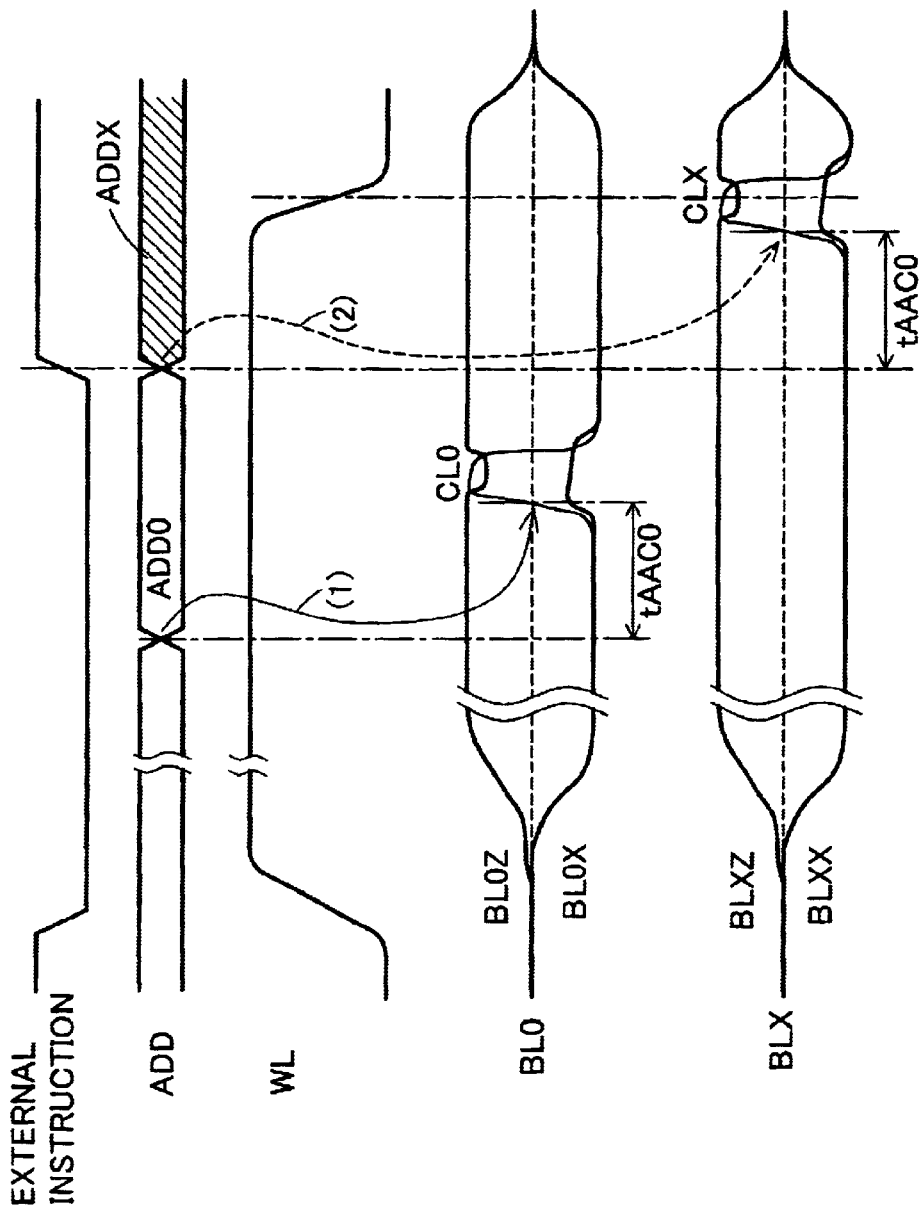
FIG. 7 shows operational waveforms for illustrating interference between address access and external instruction signal.
Figure 8:
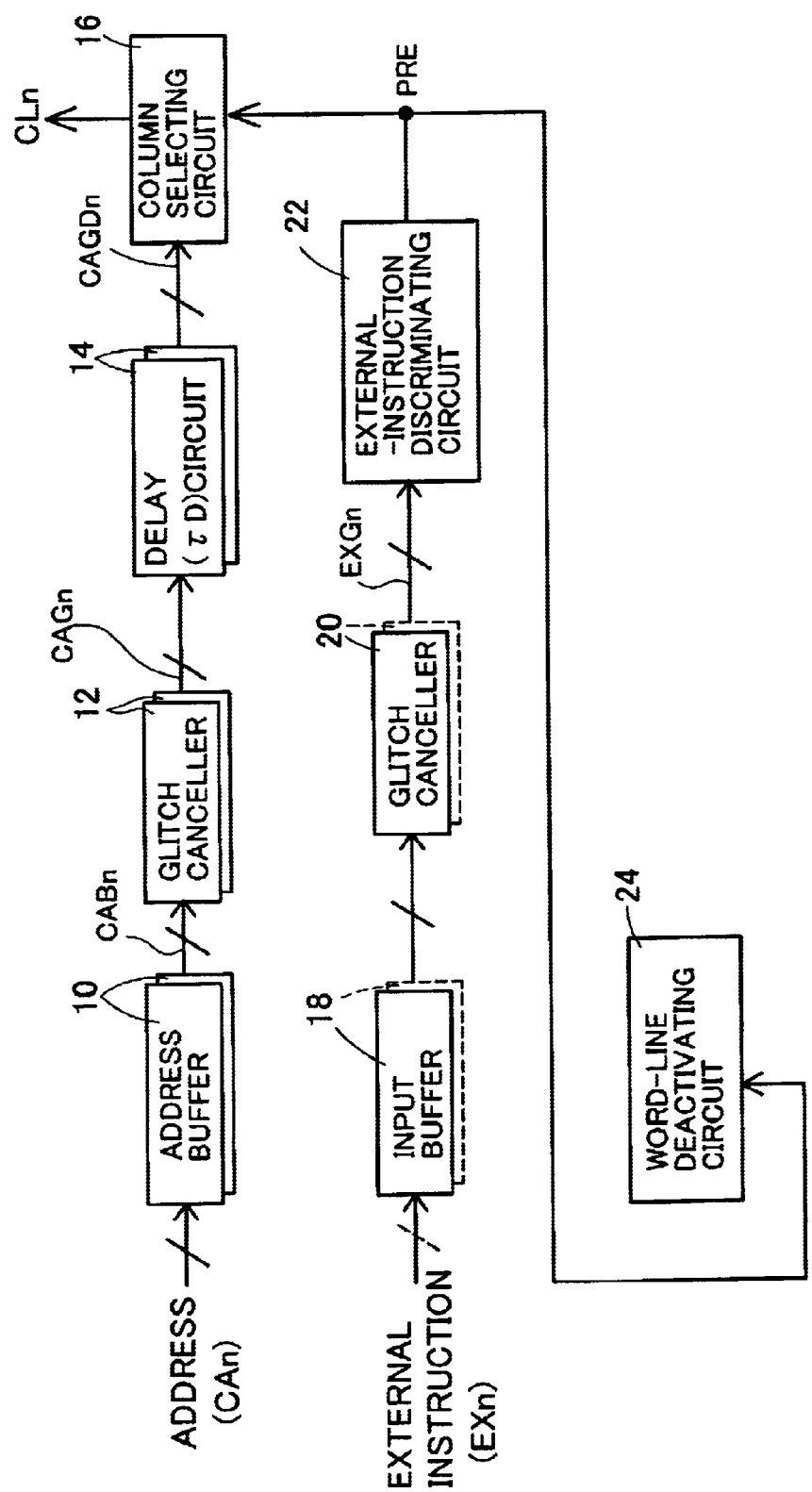
FIG. 8 shows a circuit block diagram of control section for address access directed to the related art.

FIG. 6 shows operational waveforms of the specific example shown in FIG. 5. Signals CEB, OEB make low-level transition through the input buffers 18 in response to low-level transition of external instruction signals /CE, /OE. The signals CEB, OEB is inputted to the glitch cancellers 20. Certifying signals CEBG, OEBG that made low-level transition after a lapse of delay time $\tau D1$ or $\tau D3$ are outputted from the glitch cancellers 20. The external-instruction discriminating circuit 22 applies logical multiplication operation to certifying signals CEBG and OEBG, whereby precharge signal PRE makes low-level transition and becomes active.

After the precharge signal PRE makes low-level transition and becomes active, a word line WL is activated, each memory cell is connected to each bit line, and stored charges are read out. After that, a sense-amplifier-activating signal SAE makes high-level transition and differential amplification of pairs of bit lines (BL0Z, BL0X) and (BL1Z and BL1X) is started (A pair of bit lines (BL1Z, BL1X) is not shown). After a lapse of delay time $\tau D5$, high-level pulse signal is generated from the low-input-high-pulse generating circuit. Consequently, high-level pulse signal is outputted to address transition signals ATD0, ATD1 and a column selecting signal CL1 corresponding to column address signals decoded at this stage (CA0: low-level, CA1: high-level) is selected as high-level pulse signal. Since a pair of bit lines (BL0Z and BL0X) is not connected to the pair of data lines (DB and /DB) at this stage, disturb phenomenon of bit lines does not occur.

Provided that column address signals CA0 and CA1 make high-level transition and low-level transition, respectively, at the same time when an external instruction signal /OE makes high-level transition and give a deactivation instruction. Upon receipt of high-level transition of the external instruction signal /OE, the input buffer 18 outputs a signal OEB that has made high-level transition. At the same time, the address buffers 10 output a signal CAB0 that has made high-level transition and a signal CAB1 that has made low-level transition. The signal OEB is outputted as certifying signal OEBG for certifying high-level transition through the glitch canceller 20 after a lapse of delay time $\tau D1$ or $\tau D3$. Along with high-level transition of the certifying signal OEBG, a word line WL is deactivated making low-level transition.

At the same time, signals CAB0, CAB1 are propagated to the glitch cancellers 12. After a lapse of delay time $\tau D1$ or $\tau D3$, address transition is detected and a low-level pulse signal is outputted to a output terminal n1 of the NOR gate R6. However, a signal OEB inputted to an input terminal of the NOR gate R7 that outputs address transition signals ATD0, ATD1 makes high-level transition before the low-level pulse signal is outputted to the output terminal n1 of the NOR gate R6. Accordingly, the address transition signals ATD0, ATD1 are fixed to low level and there is never selected a column selecting signal CL0 accompanied by address transition.

As described, according to the semiconductor memory device and control method thereof directed to the present embodiment, delay time $\tau D1$ or $\tau D3$ eliminates glitch noises from external instruction signals EXn (/CE, /OE) and consequently, the external instruction signals EXn (/CE, /OE) are certified as valid. Prior to the validation of the external instruction signals EXn (/CE, /OE), the column selecting circuit 16 is deactivated based on a signal OEB outputted from the input buffer 18. Thereby, there is never selected a column selecting signal CL0 accompanied by transition of column address signals CA0, CA1 that are external address signals. As a result, corresponding column gates T0Z and T0X do not become conductive and a pair of bit lines (BL0Z, BL0X) and a pair of data lines (DB, /DB) are connected to each other. After that, it is certified that high-level transition of the signal OEB is equivalent to high-level transition of /OE, whereby precharge signal PRE is activated and a word line is deactivated. At this stage, the pair of bit lines (BL0Z, BL0X) and the pair of data lines (DB, /DB), corresponding to column address signal CA0, CA1, are not connected to each other. Disturb phenomenon due to connection between the pair of bit lines and that of the data lines does not occur while the word line WL is deactivated. Accordingly, data-holding characteristic to memory cells does not deteriorate.

Furthermore, it is not necessary to insert propagation delay in a signal paths for certifying column address signals CA0, CA1 so as to prevent connection of bit lines and data lines and deactivation of a word line from occurring concurrently. Accordingly, there never increases access time for address access made in response to transition of column address signals CA0, CA1.

Furthermore, there can be made connection control of bit lines and data lines earlier by time difference of $\tau D1$ or $\tau D3$, predetermined delay time. Thereby, without adding signal propagation delay to column address signals CA0, CA1, it can be avoided that deactivation of a word line WL and connection of bit lines and data lines occur concurrently.

Furthermore, an occurrence period of pulse-state glitch noises due to chattering during signal transition of an inputted signal OEB and signals CAB0, CAB1 lasts for predetermined length of time from the signal transition. Accordingly, this occurrence period of glitch noises may be used delay time $\tau D1$ or $\tau D3$ that is equivalent to the predetermined length of time so that connection control of bit lines and data lines can be done prior to deactivation control of a word line WL.

Furthermore, in case column address signals CA0, CA1 make transition after high-level transition of an external instruction signal /OE that is to deactivate a word line WL, connection of bit lines and data lines can be prohibited before glitch noises due to signal transition are eliminated and it is certified that signals that have made transition are equivalent to transition of valid column address signals CA0, CA1. That is, connection of bit lines and data lines can be prohibited before different bit lines are selected due to transition of the column address signals CA0, CA1.

Furthermore, since there can be prohibited connection of bit lines and data lines before a precharge signal PRE deactivates a word line WL, bit lines and data lines are not connected to each other when a word line is deactivated.

The present invention is not limited to the embodiment described above and may of course be improved or modified in various manners within the scope and spirit of the present invention.

For example, though the present embodiment describes memory cell structure of a DRAM or the like that stores data in a form of stored charge. However, the present invention is applicable to a semiconductor memory device having memory cell structure that is likely to accompany deterioration of recorded-data holding characteristic at the time of data access.

According to the present invention made for a semiconductor memory device that has address-access function to execute data access to corresponding memory cells in response to transition of address signals on demand while the semiconductor memory device is in active state, there is provided an inventive semiconductor memory device and control method thereof capable of preventing shift operation to deactivated state and data access due to transition of address signals from occurring concurrently without accompanying delay of access time, thereby to prevent data-holding characteristic of memory cell from deteriorating.

What is claimed is:

1. A semiconductor memory device comprising:
    a plurality of column selecting switches for connecting one of a plurality of bit lines, each of which is connected to memory cells, and a data input/output line when a word line is activated based on at least one external control signal;
    a column selecting section for selecting a column selecting switch corresponding to at least one external address signal that has made address transition every time at least one external address signal makes address transition while the word line is in active state;
    at least one control-signal certifying section for outputting a certified control signal in case transition of a signal inputted to an external control terminal is certified valid as the external control signal; and
    at least one address certifying section for outputting at least one certified address signal in case transition of a signal inputted to an external address terminal is certified valid as the external address signal;
    wherein the column selecting section is controlled to be active in accordance with transition of a signal inputted to the external control terminal.

2. A semiconductor memory device according to claim 1, wherein, after a lapse of predetermined delay time that begins with transition of input signals inputted to the external control terminal and the external address terminal, the control signal certifying section and the address certifying section output the certified control signal and the certified address signal, respectively.

3. A semiconductor memory device according to claim 1, wherein at least either one of the control signal certifying section or the address certifying section is a glitch cancel circuit.

4. A semiconductor memory device according to claim 1, wherein, in case at least one of the external address signals inputted to the external address terminals makes address transition at the same time or after at least one of the external control signals for deactivating the word line is inputted to the external control terminals, the column selecting section is deactivated based on transition of at least one of the external control signals inputted to the external control terminals before at least one certified address signal that has made address transition propagates to the column selecting section.

5. A semiconductor memory device according to claim 1, wherein the column selecting section is deactivated based on at least one of the external control signals prior to deactivation of the word line.

6. A control method of semiconductor device, while a word line is in active state, the control method comprising:
    address signal certifying process for certifying whether or not transition of a signal inputted to at least one external address terminal is valid as an external address signal;
    control signal certifying process for certifying whether or not transition of a signal inputted to at least one external control terminal is valid as an external control signal;
    word line deactivating process for deactivating a word line based on the external control signal; and
    column-selection deactivating process for prohibiting connection of a bit line corresponding to the external address signals and a data input/output line based on transition of a signal inputted to the external control terminal.

7. A control method of semiconductor device according to claim 6, wherein, after a lapse of predetermined delay time that begins with transition of input signals inputted to the external control terminal and the external terminal, the address signal certifying process and the control signal certifying process certify whether or not the input signals are a valid external address signal and a valid external control signal, respectively.

8. A control method of semiconductor device according to claim 6, wherein at least either signal-certifying procedure at the address signal certifying process or signal-certifying procedure at the control signal certifying process corresponds to glitch-noise-eliminating procedure for eliminating glitch noises that occur to input signals inputted to the external address terminal or the external control terminal.

9. A control method of semiconductor device according to claim 6, wherein, in case at least one of the external address signals inputted to the external address terminals makes address transition at the same time or after at least one of the external control signals for deactivating the word line is inputted to the external control terminals, the column-selection deactivating process prohibits connection of the bit line and the data input/output line before the address signal certifying process takes procedure to certify validity of the external address signals.

10. A control method of semiconductor device according to claim 6, wherein the column-selection deactivating process prohibits connection of the bit line and the data input/output line prior to deactivation of the word line by the word line deactivating process.

* * * * *